United States Patent
Hahn et al.

(10) Patent No.: US 9,898,229 B1
(45) Date of Patent: Feb. 20, 2018

(54) SYSTEMS AND METHODS OF MEMORY READS

(71) Applicant: SANDISK TECHNOLOGIES LLC, Plano, TX (US)

(72) Inventors: Judah Gamliel Hahn, Ofra (IL); Gadi Vishne, Petach-Tikva (IL); Joshua Lehmann, Modiin (IL); Alexander Bazarsky, Holon (IL); Ariel Navon, Revava (IL)

(73) Assignee: SANDISK TECHNOLOGIES LLC, Plano, TX (US)

( * ) Notice: Subject to any disclaimer, the term of this patent is extended or adjusted under 35 U.S.C. 154(b) by 0 days.

(21) Appl. No.: 15/223,595

(22) Filed: Jul. 29, 2016

(51) Int. Cl.
    G11C 16/06      (2006.01)
    G06F 3/06       (2006.01)
    G06F 11/10      (2006.01)
    G11C 29/52      (2006.01)

(52) U.S. Cl.
    CPC .......... *G06F 3/0659* (2013.01); *G06F 3/0604* (2013.01); *G06F 3/0653* (2013.01); *G06F 3/0673* (2013.01); *G06F 11/1068* (2013.01); *G11C 29/52* (2013.01)

(58) Field of Classification Search
    CPC .... G06F 3/0659; G06F 3/0604; G06F 3/0653; G06F 3/0673; G06F 11/1068
    See application file for complete search history.

(56) References Cited

U.S. PATENT DOCUMENTS

| | | | |
|---|---|---|---|
| 6,189,070 B1 | 2/2001 | See et al. | |
| 7,062,616 B2 | 6/2006 | Sadhasivan et al. | |
| 7,206,230 B2 | 4/2007 | Li et al. | |
| 8,051,366 B2 | 11/2011 | Maeto | |
| 8,799,653 B2 | 8/2014 | Sela et al. | |
| 9,274,886 B2* | 3/2016 | Chae | G06F 11/1048 |
| 9,304,855 B2* | 4/2016 | Kang | G06F 11/1048 |
| 2009/0225603 A1 | 9/2009 | Chun et al. | |
| 2012/0167100 A1 | 6/2012 | Li et al. | |
| 2015/0248250 A1* | 9/2015 | Han | G06F 3/0619 711/103 |
| 2016/0172042 A1 | 6/2016 | Kang | |

OTHER PUBLICATIONS

Invitation to Pay Additional Fees and, Where Applicable, Protest Fee and Partial International Search Report dated Sep. 19, 2017, in International Application No. PCT/US2017/035115, 13 pages.

\* cited by examiner

*Primary Examiner* — Pho M Luu
(74) *Attorney, Agent, or Firm* — Toler Law Group, PC

(57) ABSTRACT

A data storage device includes a non-volatile memory and a controller coupled to the non-volatile memory. The controller is configured to initiate a read operation to retrieve data from the non-volatile memory. The controller is also configured to suspend the read operation and to determine context information associated with the suspended read operation. The controller is further configured, in response to detecting a condition indicating that the read operation is to resume, to resume the suspended read operation using the context information.

20 Claims, 8 Drawing Sheets

SYSTEMS AND METHODS OF MEMORY READS

FIELD OF THE DISCLOSURE

The present disclosure is generally related to reading data from a memory.

BACKGROUND

Generally, data storage devices are configured to write data to memory and read the data from the memory. An access device coupled to a data storage device may send a first read request to read data from a memory address. The data storage device may start a read operation responsive to the first read request. For example, the data storage device may read data from a memory location corresponding to the address and may perform decode operations on the read data. The data storage device may perform one or more stages of decoding and may provide decoded data to the access device in response to detecting that a first decode stage (e.g., error correction code (ECC) decoding) succeeded. Alternatively, the data storage device may proceed to a second decode stage (e.g., redundant array of independent disks (RAID) decoding) in response to detecting a failure at the first decode stage. Performing a greater number of the decode stages may use more resources (e.g., time and processing cycles) and increase read latency.

In some circumstances, the access device may issue an abort command to the data storage device in response to determining that the data storage device is taking too long to respond to the first read request. For example, the access device may issue the abort command in response to determining that a higher priority operation is to be performed by the access device. The access device may subsequently send a second read request to the data storage device indicating the same address of the memory. The data storage device may restart the read operation responsive to the second read request. For example, the data storage device may perform the first decode stage again and the first decode stage may fail again. Interrupting and restarting a read operation to a memory location may use more resources (e.g., time and processing cycles) overall.

DETAILED DESCRIPTION

Particular aspects of the disclosure are described below with reference to the drawings. In the description, common features are designated by common reference numbers. As used herein, "exemplary" may indicate an example, an implementation, and/or an aspect, and should not be construed as limiting or as indicating a preference or a preferred implementation.

Figure 1:
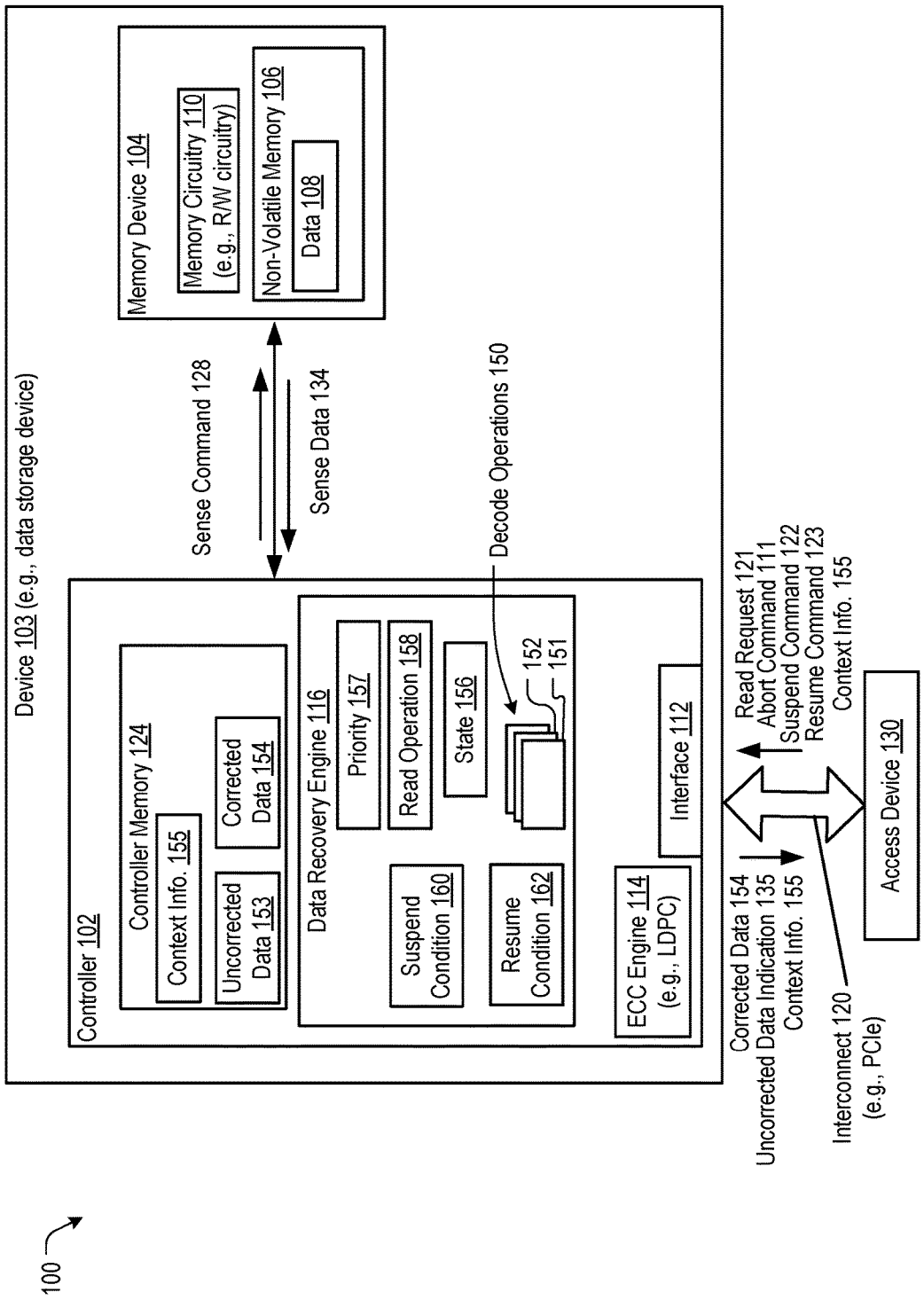
FIG. 1 is a block diagram of an illustrative example of a system including a data storage device coupled to an access device.

Referring to FIG. 1, a particular embodiment of a system 100 includes a device 103 (e.g., a data storage device) coupled to an access device 130. The device 103 includes a memory device 104 coupled to a controller 102. The controller 102 is configured to suspend a read operation at the memory device 104 in response to detecting a suspend condition and to store context information associated with the suspended read operation, provide the context information to the access device 130, or both. In response to detecting a resume condition, the controller 102 may resume the read operation based on the stored context information or based on context information received from the access device 130. Resuming the read operation based on context information (as compared to restarting the read operation independently of the context information) may reduce a read latency at the access device 130.

The access device 130 may be configured to provide data to be stored at the memory device 104 or to request data to be read from the memory device 104. The access device 130 may be coupled to the device 103 via a connection (e.g., an interconnect 120), such as a bus, a network, or a wireless connection. For example, the interconnect 120 may correspond to a peripheral component interconnect (PCIe) bus. The device 103 may include an interface 112 (e.g., an access device interface) that enables communication via the interconnect 120 between the device 103 and the access device 130. For example, the access device 130 may operate in compliance with a Joint Electron Devices Engineering Council (JEDEC) industry specification, such as a Universal Flash Storage (UFS) Host Controller Interface specification. As another example, the access device 130 may operate in compliance with one or more other specifications, such as a Secure Digital (SD) Host Controller specification as an illustrative example. The access device 130 may communicate with the memory device 104 in accordance with any other suitable communication protocol. The access device 130 may include a mobile telephone, a computer (e.g., a laptop, a tablet, or a notebook computer), a music player, a video player, a gaming device or console, an electronic book reader, a personal digital assistant (PDA), a portable navigation device, or other device that uses non-volatile memory.

In some implementations, the device 103 may be a memory card, such as a Secure Digital SD® card, a microSD™ card, a miniSD™ card (trademarks of SD-3C LLC, Wilmington, Del.), a MultiMediaCard™ (MMC™) card (trademark of JEDEC Solid State Technology Association, Arlington, Va.), or a CompactFlash® (CF) card (trademark of SanDisk Corporation, Milpitas, Calif.). In other implementations, the device 103 may be configured to be coupled to the access device 130 as embedded memory, such as eMMC® (trademark of JEDEC Solid State Technology Association, Arlington, Va.) and eSD, as illustrative examples. For example, the device 103 may correspond to an eMMC (embedded MultiMedia Card) device. The device 103 may operate in compliance with a JEDEC industry specification. For example, the device 103 may operate in compliance with a JEDEC eMMC specification, a JEDEC Universal Flash Storage (UFS) specification, one or more other specifications, or a combination thereof.

The memory device 104 may include a non-volatile memory 106. The non-volatile memory 106 may include a flash memory, such as a NAND flash memory, as an illustrative, non-limiting example. The non-volatile memory 106 may have a three-dimensional (3D) memory configuration. As an example, the non-volatile memory 106 may have a 3D vertical bit line (VBL) configuration. In a particular implementation, the non-volatile memory 106 has a 3D memory configuration that is monolithically formed in one or more physical levels of arrays of memory cells having an active area disposed above a silicon substrate. Alternatively, the non-volatile memory 106 may have another configuration, such as a two-dimensional (2D) memory configuration or a non-monolithic 3D memory configuration (e.g., a stacked die 3D memory configuration).

The memory device 104 may include support circuitry, such as memory circuitry 110 (e.g., read/write circuitry), to support operation of one or more memory dies of the memory device 104. Although depicted as a single component, the memory circuitry 110 may be divided into separate components of the memory device 104, such as read circuitry and write circuitry. The memory circuitry 110 may be external to the one or more dies of the memory device 104. Alternatively, one or more individual memory dies of the memory device 104 may include corresponding memory circuitry that is operable to read data from and/or write data to storage elements within the individual memory die independent of any other read and/or write operations at any of the other memory dies.

The non-volatile memory 106 may include storage elements at one or more dies. Each of the one or more dies may include one or more blocks, such as a NAND flash erase group of storage elements. Each of the blocks may include one or more groups of storage elements (e.g., flash memory cells). Each group of storage elements may include multiple storage elements (e.g., memory cells) and may be configured as a word line. A word line may function as a single-level-cell (SLC) word line coupled to storage elements that store one bit per storage element, as a multi-level-cell (MLC) word line coupled to storage elements that store two bits per storage element, or as a tri-level-cell (TLC) word line coupled to storage elements that store three bits per storage element, as illustrative, non-limiting examples. Each storage element of the non-volatile memory 106 may be programmable to a state (e.g., a threshold voltage in a flash configuration or a resistive state in a resistive memory configuration) that indicates one or more values.

The controller 102 is configured to receive data and instructions from and to send data to the access device 130 while the device 103 is operatively coupled to the access device 130. The controller 102 is further configured to send data and commands to the memory device 104 and to receive data from the memory device 104. The controller 102 may include a controller memory 124, a data recovery engine 116, and an error correction code (ECC) engine 114.

The controller 102 is configured to receive data and instructions from the access device 130 and to send data to the access device 130. For example, the controller 102 may send data to the access device 130 via the interconnect 120, and the controller 102 may receive data from the access device 130 via the interconnect 120. The controller 102 is configured to send data and commands to the memory device 104 and to receive data from the memory device 104. For example, the controller 102 is configured to send data and a write command to cause the memory device 104 to store data to an address of the memory device 104. The write command may specify a physical address of a portion of the memory device 104 (e.g., a physical address of a word line of the memory device 104) that is to store the data. The controller 102 may also be configured to send data and commands to the memory device 104 associated with background scanning operations, garbage collection operations, and/or wear leveling operations, etc., as illustrative, non-limiting examples. The controller 102 is configured to send a read command to the memory device 104 to access data from a specified address of the memory device 104. The read command may specify the physical address of a portion of the memory device 104 (e.g., a physical address of a word line of the memory device 104).

The ECC engine 114 may include an encoder configured to encode one or more data words using an ECC encoding technique. The ECC engine 114 may include a Reed-Solomon encoder, a Bose-Chaudhuri-Hocquenghem (BCH) encoder, a low-density parity check (LDPC) encoder, a turbo encoder, an encoder configured to encode the data according to one or more other ECC techniques, or a combination thereof, as illustrative, non-limiting examples. The ECC engine 114 may also include a decoder. The decoder may be configured to decode data read from the memory device 104 to detect and correct, up to an error correction capability of the ECC scheme, bit errors that may be present in the data. The decoder may be configured to perform in multiple decoding modes. For example, the decoding modes may include a relatively low-power, high-speed decoding mode (e.g., a bit-flipping decoding mode), a full-power LDPC decoding mode with a higher correction capacity than the lower-power decoding mode, one or more other decoding modes, or a combination thereof. The decoding modes may correspond to successive decode stages. For example, the lower-power decoding mode may correspond to a first decode stage, the full-power decoding mode may correspond to a second decode stage, and the decoder may be configured to selectively perform the second decode stage in response to detecting that the first decode stage failed. The decoder may thus conserve resources (e.g., power) by performing the lower-power decoding mode and not performing the full-power decoding mode when the first decode stage is successful.

In a particular aspect, the controller 102 may include multiple decoders. For example, the controller 102 may include the decoder of the ECC engine 114, a RAID decoder, a dynamic read decoder, or a combination thereof. In this aspect, decoding modes of the multiple decoders may correspond to successive decode stages. For example, the lower-power operating mode of an ECC decoder may correspond to a first decoding stage, a full-power operating mode of the ECC decoder may correspond to a second decoding stage, a first mode of the RAID decoder may correspond to a third decoding stage, or a combination thereof.

The data recovery engine 116 may be configured to initiate a read operation 158 to retrieve data 108 from the non-volatile memory 106 in response to receiving a read request 121 (e.g., a first read request) from the access device 130. The data recovery engine 116 may be configured, in response to detecting a suspend condition 160, to suspend the read operation 158 and to generate context information 155. The data recovery engine 116 may be configured, in response to detecting a resume condition 162, to resume the read operation 158 based on the context information 155. Resuming the read operation 158 based on the context information 155 may result in reduced read latency at the device 103 as compared to restarting the read operation 158.

During operation, the data recovery engine 116 may receive the read request 121 from the access device 130. The read request 121 may indicate a logical address or a physical address corresponding to a memory location of the non-volatile memory 106. The data recovery engine 116 may initiate a read operation 158 to retrieve the data 108 from the memory location of the non-volatile memory 106 in response to receiving the read request 121 from the access device 130. The data recovery engine 116 may set a state 156 of the read operation 158 to indicate that the read operation 158 is in progress, set a priority 157 of the read operation 158 to indicate a first priority (e.g., an active priority), or both.

The data recovery engine 116 may perform the read operation 158 based on the priority 157. For example, the data recovery engine 116 may perform the read operation 158 in response to determining that the priority 157 corresponds to a particular (e.g., a highest) priority among one or more operations to be performed by the data recovery engine 116, the controller 102, or both.

Performing the read operation 158 may include at least one of sending one or more sense commands (e.g., a sense command 128) to the memory device 104, receiving sense data 134 from the memory device 104 responsive to the sense commands (e.g., the sense command 128), or performing one or more decode operations 150 based on the sense data 134.

In a particular aspect, the data recovery engine 116 performs a first decode operation 151 of the decode operations 150 by providing the sense data 134 to a first decoder (e.g., the ECC engine 114). The ECC engine 114 (e.g., a LDPC decoder) may generate corrected data 154 based on decoding the sense data 134. For example, the ECC engine 114 may generate the corrected data 154 by performing a first decode stage on the sense data 134. The ECC engine 114 may provide the corrected data 154, a decoding success indication, or both, to the data recovery engine 116. The data recovery engine 116 may detect that the first decode operation 151 has succeeded in response to receiving the corrected data 154, the decoding success indication, or both. The data recovery engine 116 may, in response to determining that the first decode operation 151 has succeeded, provide the corrected data 154 to the access device 130 and set the state 156 to indicate that the read operation 158 is completed successfully.

Alternatively, the ECC engine 114 may generate a decoding failure indication and uncorrected data 153 when a number of errors in the sense data 134 exceeds an error detection capacity of the first decode operation 151. The ECC engine 114 may provide the uncorrected data 153, a failure indication, or both, to the data recovery engine 116. The data recovery engine 116 may detect that the first decode operation 151 has failed in response to receiving the uncorrected data 153, the failure indication, or both. The data recovery engine 116 may, in response to determining that the first decode operation 151 has failed, set the state 156 to indicate that the first decode operation 151 has failed. In some aspects, the data recovery engine 116 sets the priority 157 of the read operation 158 to indicate a second priority (e.g., a background priority) in response to determining that the first decode operation 151 has failed. In alternative aspects, the data recovery engine 116 leaves the priority 157 of the read operation 158 unchanged in response to determining that the first decode operation 151 has failed.

The data recovery engine 116 may, in response to determining that the first decode operation 151 has failed, determine whether to perform a second decode operation 152 subsequent to detecting failure of the first decode operation 151. The data recovery engine 116 may, in response to determining that the second decode operation 152 is not available, detect that the read operation 158 has failed and set the state 156 to indicate that the read operation 158 is completed unsuccessfully (e.g., has failed). Alternatively, the data recovery engine 116 may initiate the second decode operation 152 in response to determining that the second decode operation 152 is available subsequent to detecting failure of the first decode operation 151.

The data recovery engine 116 may, responsive to detecting failure of the first decode operation 151, update (or generate) the context information 155. For example, the context information 155 may include an indication of a decoder memory state (e.g., a memory state of the ECC engine 114), an indication that the first decode operation 151 failed, the uncorrected data 153, an indication of the first decode stage, or a combination thereof. The data recovery engine 116 may, responsive to detecting failure of the first decode operation 151, provide the context information 155, an uncorrected data indication 135, or both, to the access device 130.

Performing the second decode operation 152 may include providing the address of the memory location, the sense data 134, the uncorrected data 153, or a combination thereof, to the ECC engine 114 or to another decoder (e.g., a redundant array of independent disks (RAID) decoder). For example, the data recovery engine 116 may perform the first decode operation 151 by instructing the ECC engine 114 to perform a first decode stage on the sense data 134. In this example, the data recovery engine 116 may, in response to determining that the ECC engine 114 is configured to perform a second decode stage subsequent to failure of the first decode stage (e.g., using a higher-power decoding mode), perform the second decode operation 152 by instructing the ECC engine 114 to perform the second decode stage on the sense data 134 or the uncorrected data 153. Alternatively, the data recovery engine 116 may, in response to determining that the ECC engine 114 is not configured to perform any decode stages subsequent to failure of the first decode stage (e.g., the first decode stage corresponds to a higher-power decode stage), perform the second decode operation 152 by instructing a RAID decoder to generate data associated with the address. To illustrate, the RAID decoder may generate the corrected data 154 by reading data corresponding to a RAID group from one or more other memory locations of the non-volatile memory 106.

The data recovery engine 116 may be configured to detect a suspend condition 160 indicating that the read operation 158 is to be suspended. For example, the suspend condition 160 may include failure of the first decode operation 151, receipt of an abort command 111, receipt of a suspend command 122, or a combination thereof. The abort command 111 (or the suspend command 122) may indicate at least one of the read request 121 or the address of the memory location. Receipt of the suspend command 122 may indicate that the access device 130 is likely to send a resume command 123 associated with the read request 121.

The data recovery engine 116 may be configured to suspend the read operation 158 in response to detecting the suspend condition 160. Suspending the read operation 158 may include setting the state 156 to indicate that the read operation 158 is suspended. In a particular aspect, the data recovery engine 116 suspends the read operation 158 by stopping the read operation 158. For example, the data recovery engine 116 may, in response to detecting the suspend condition 160 during performance of the first decode operation 151, suspend the read operation 158 by instructing the ECC engine 114 to interrupt the first decode stage, by refraining from performing the second decode operation 152 responsive to detecting that the first decode operation 151 failed, or both.

In an alternative aspect, the data recovery engine 116 suspends the read operation 158 by performing the read operation 158 in the background, reducing a priority associated with the read operation 158, or both. For example, the data recovery engine 116 may update the priority 157 to indicate that the read operation 158 has a second priority (e.g., a background priority). The second priority (e.g., the background priority) may be lower than the first priority (e.g., the active priority).

In some implementations, the data recovery engine 116 may perform one or more distinct operations if the suspend condition 160 corresponds to receipt of the suspend command 122 as compared to receipt of the abort command 111. For example, the data recovery engine 116 may update the priority 157 to indicate a first particular priority (e.g., a first background priority) if the suspend condition 160 includes receipt of the suspend command 122 or a second particular priority (e.g., a second background priority) if the suspend condition 160 includes receipt of the abort command 111. The first particular priority (e.g., the first background priority) may be greater than the second particular priority (e.g., the second background priority) and may be lower than the first priority (e.g., the active priority). The data recovery engine 116 may be configured to schedule operations based on priority. To illustrate, the data recovery engine 116 may perform a first read operation having a first priority prior to performing in a second read operation having a second priority that is lower than the first priority.

The data recovery engine 116 may, responsive to suspending the read operation 158, update (or generate) the context information 155 to include an indication of a decoder memory state (e.g., a memory state of the ECC engine 114), an indication of whether the first decode operation 151 failed or was interrupted, a location of the uncorrected data 153, an indication of the first decode stage, or a combination thereof. In some implementations, the data recovery engine 116 may, responsive to suspending the read operation 158, store the context information 155 at the controller memory 124. Alternatively, or in addition, the data recovery engine 116 may provide the context information 155, the uncorrected data indication 135, or both, to the access device 130 responsive to suspending the read operation 158.

Continuing to process the read operation 158 as a low-priority or background process subsequent to detecting the suspend condition 160 may result in completion of the read operation 158. In this case, the data recovery engine 116 may have the corrected data 154 available to provide to the access device 130. The data recovery engine 116 may store the corrected data 154 in the controller memory 124.

The data recovery engine 116 may also be configured to detect a resume condition 162 indicating that the read operation 158 is to be resumed. The resume condition 162 may include receipt of the read request 121 (e.g., a second read request), receipt of the resume command 123, or both. In a particular aspect, the resume command 123 (or the read request 121) corresponds to a request for a corrected version of the uncorrected data 153. The read request 121 (e.g., the second read request) may indicate the address of the memory location. The resume command 123 may indicate at least one of the read request 121 (e.g., the first read request) or the address of the memory location. In a particular aspect, the access device 130 may send the context information 155, in conjunction with the resume command 123 (or the abort command 111), to the device 103.

The data recovery engine 116 may, in response to detecting the resume condition 162, determine whether the read operation 158 has been completed. The data recovery engine 116 may, in response to determining that the state 156 indicates that the read operation 158 has completed successfully, provide the corrected data 154 to the access device 130 subsequent to detecting the resume condition 162. Alternatively, the data recovery engine 116 may, in response to determining that the state 156 indicates that the read operation 158 has completed unsuccessfully (e.g., RAID decoding has been performed in the background and has also failed), provide a failure indication to the access device 130 subsequent to detecting the resume condition 162.

In some aspect, the data recovery engine 116 may, subsequent to detecting the resume condition 162, determine that the read operation 158 is not completed. For example, the data recovery engine 116 may determine that the read operation 158 is incomplete in response to determining that the state 156 indicates that the read operation 158 is in-progress or is suspended. The data recovery engine 116 may, in response to detecting the resume condition 162 and determining that the read operation 158 is incomplete, resume the read operation 158 based on the context information 155.

Resuming the read operation 158 may include updating the state 156 to indicate that the read operation 158 is in-progress, updating the priority 157 to indicate that the read operation 158 has a first priority (e.g., an active priority), performing one or more of the decode operations 150 based on the context information 155, or a combination thereof. The data recovery engine 116 may resume the read operation 158 based on the context information 155 stored in the controller memory 124, the context information 155 received from the access device 130, or both. The data recovery engine 116 may, in response to determining that the context information 155 indicates that the first decode operation 151 was interrupted, resume the read operation 158 by instructing the ECC engine 114 to resume decoding of the uncorrected data 153, the sense data 134, or both, indicated by the context information 155. For example, the ECC engine 114 may perform the first decode stage based on the decoder memory state indicated by the context information 155. As another example, the data recovery engine 116 may, in response to determining that the context information 155 indicates that the first decode operation 151 failed, resume the read operation 158 by performing the second decode operation 152 based on the uncorrected data 153, the sense data 134, or both, indicated by the context information 155.

In some implementations, the data recovery engine 116 resumes the read operation 158 based on a most recent version of the context information 155 available at the device 103. For example, the context information 155 received from the access device 130 may include an indication of a first version and the context information 155 stored at the controller memory 124 may include an indication of a second version. The second version may be distinct from the first version. For example, the data recovery engine 116 may have updated the context information 155 stored at the controller memory 124 subsequent to providing the context information 155 to the access device 130. The data recovery engine 116 may resume the read operation 158 based on the context information 155 stored at the controller memory 124 in response to determining that the second version is the same as or subsequent to the first version. Alternatively, the data recovery engine 116 may resume the read operation 158 based on the context information 155 received from the access device 130 in response to determining that the second version is prior to the first version.

The data recovery engine 116 may be configured to update the uncorrected data 153 or generate the corrected data 154 by performing at least one of the decoding operations 150 (e.g., the second decode operation 152). The data recovery engine 116 may be configured to provide the uncorrected data 153 or the corrected data 154 to the access device 130.

The system 100 may enable the read operation 158 to be resumed based on the context information 155 responsive to detection of the resume condition 162. Resuming the read operation 158 based on the context information 155 may save time as compared to restarting the read operation 158 independently of the context information 155. In some aspects, the read operation 158 may continue to be performed in the background subsequent to detection of the suspend condition 160. A latency associated with the read request 121 (e.g., the second read request) at the access device 130 may be reduced as compared to restarting the read operation 158 (independently of the context information 155) responsive to the resume condition 162.

Although receipt of the read request 121 (e.g., the second read request) is described as an example of the resume condition 162, in other implementations, receipt of the read request 121 (e.g., the second read request) instead indicates that the read operation 158 is to be restarted. Receipt of the resume command 123 may correspond to the resume condition 162. For example, the data recovery engine 116 may initiate (e.g., restart) the read operation 158 independently of the context information 155 in response to receiving the read request 121 (e.g., the second read request). In contrast, the data recovery engine 116 may resume the read operation 158 based on the context information 155 in response to receipt of the resume command 123.

Figure 2:
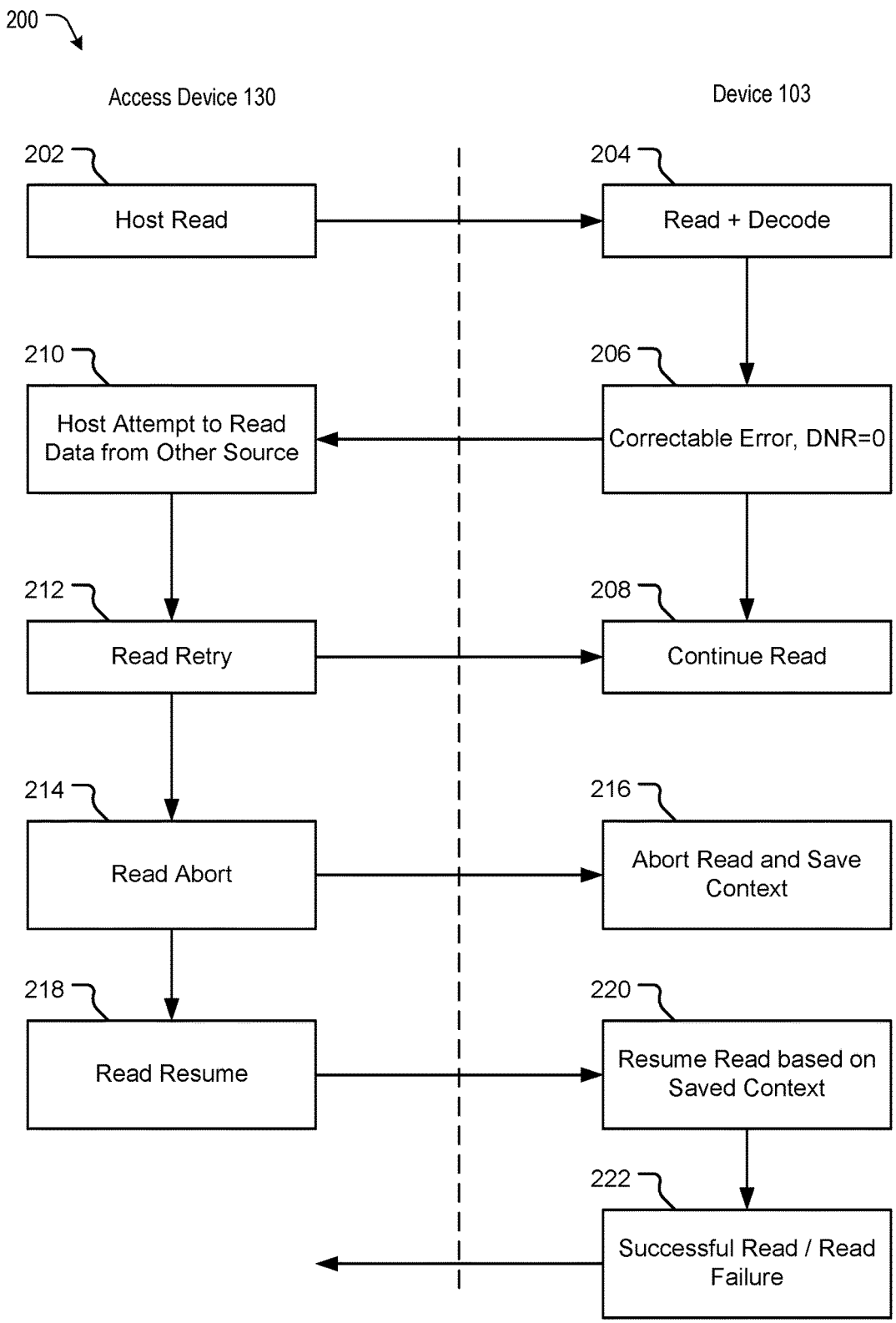
FIG. 2 is a diagram of an illustrative example of a sequence of operations that may be performed by the data storage device and the access device of the system of FIG. 1.

Referring to FIG. 2, a diagram illustrates an example of operations generally designated 200. One or more of the operations 200 may be performed by the access device 130 or the device 103 (e.g., a data storage device) of FIG. 1.

The operations 200 include a host read, at 202. For example, the access device 130 of FIG. 1 may send the read request 121 to the device 103. The read request 121 may indicate an address of a memory location.

The operations 200 also include reading and decoding, at 204. For example, the data recovery engine 116 of FIG. 1 may send one or more sense commands (e.g., the sense command 128) to the memory device 104 in response to receiving the read request 121 from access device 130. The sense command 128 may indicate the address of the memory location (e.g., the address of the data 108). The memory circuitry 110 may, in response to receiving the one or more sense commands, generate the sense data 134 by performing one or more sense operations at memory location. The memory device 104 may provide the sense data 134 to the controller 102.

The operations 200 further include detecting a correctable error and setting a do-not-retry parameter to 0, at 206. For example, the data recovery engine 116 of FIG. 1 may perform the first decode operation 151 based on the sense data 134, as described with reference to FIG. 1. The data recovery engine 116 may determine that the first decode operation 151 failed and that the read operation 158 is not finished, as described with reference to FIG. 1. For example, the data recovery engine 116 may determine that the read operation 158 is not finished in response to determining that the decode operations 150 include the second decode operation 152 that is to be performed subsequent to failure of the first decode operation 151. The data recovery engine 116 may, in response to determining that the read operation 158 is not finished, determine that recovery may be possible even though a decoding error was encountered in the read operation 158 (e.g., performing the first decode operation 151). For example, the data recovery engine 116 may determine that the second decode operation 152 remains to be performed to recover from the failure of the first decode operation 151.

The data recovery engine 116 may provide the uncorrected data indication 135 to the access device 130 in response to determining that the first decode operation 151 failed and that the read operation 158 is not finished. The uncorrected data indication 135 may indicate that a do-not-retry (DNR) parameter has a first value (e.g., 0 or false). The first value of the DNR parameter may indicate that the read operation 158 is not finished and that a retry (or resume) of the read operation 158 may be successful. The uncorrected data indication 135 may indicate that at least one of the decode operations 150 (e.g., the first decode operation 151) has failed and that the decode operations 150 include at least one decode operation (e.g., the second decode operation 152) that remains to be performed.

The operations 200 may also include continuing the read operation, at 208. For example, the data recovery engine 116 of FIG. 1 may continue the read operation 158 subsequent to detecting that the first decode operation 151 failed and providing the uncorrected data indication 135 to the access device 130. To illustrate, the data recovery engine 116 may continue the read operation 158 by performing the second decode operation 152. In a particular aspect, the data recovery engine 116 updates the priority 157 to indicate that the read operation 158 has a second priority (e.g., a background priority) subsequent to detecting that the first decode operation 151 failed, providing the uncorrected data indication 135 to the access device 130, or both.

The operations 200 may further include host attempt to read data from other source, at 210. For example, the access device 130 of FIG. 1 may, in response to receiving the uncorrected data indication 135, determine whether the data to be read by the read operation 158 is also available from another data storage device. The access device 130 may perform one or more operations that have higher priority at the access device 130 than a priority associated with the read operation 158 at the access device 130.

The operations 200 also include read retry, at 212. For example, the access device 130 of FIG. 1 may send the read request 121 (e.g., a second read request) or the resume command 123 to the device 103 indicating the address of the memory location. For example, the access device 130 may send the read request 121 (or the resume command 123) to the device 103 in response to determining that the data to be read by the read operation 158 is not available from another data storage device. In a particular aspect, the access device 130 may send the read request 121 (or the resume command 123) to the device 103 based at least in part on determining that a particular (e.g., highest) priority is associated with the read operation 158 at the access device 130 among operations to be performed by the access device 130. The operations 200 proceed to 208, where the data recovery engine 116 of FIG. 1 may continue the read operation 158 in response to receiving the read request 121 (e.g., the second read request) or the resume command 123. In a particular aspect, the data recovery engine 116, in response to receiving the read request 121 (or the resume command 123), updates the priority 157 to indicate that the read operation 158 has a first priority (e.g., an active priority).

The operations 200 may further include a read abort, at 214. For example, the access device 130 of FIG. 1 may send the abort command 111 to the device 103. In a particular aspect, the access device 130 sends the abort command 111 to the device 103 in response to determining that one or more higher priority operations are to be performed at the access device 130.

The operations 200 may also include aborting read and saving context, at 216. For example, the data recovery engine 116 of FIG. 1 may suspend the read operation 158 in response to receiving the abort command 111 and may store the context information 155 in the controller memory 124, as described with reference to FIG. 1.

The operations 200 may further include read resume, at 218. For example, the access device 130 may send the resume command 123 (or the read request 121) to the device 103 subsequent to sending the abort command 111. In a particular aspect, the access device 130 sends the resume command 123 (or the read request 121) to the device 103 in response to determining that the read operation 158 is associated with a particular priority (e.g., a highest priority) among operations to be performed at the access device 130.

The operations 200 may also include resuming read based on saved context, at 220. For example, the data recovery engine 116 of FIG. 1 may, in response to detecting the resume condition 162 (e.g., receiving the resume command 123 or the read request 121), resume the read operation 158 based on the context information 155, as described with reference to FIG. 1.

The operations 200 may further include determining successful read or read failure, at 222. For example, the data recovery engine 116 of FIG. 1 may determine whether the read operation 158 has completed successfully or completed unsuccessfully, as described with reference to FIG. 1. The data recovery engine 116 may provide the corrected data 154 to the access device 130 in response to determining that the read operation 158 has completed successfully. Alternatively, the data recovery engine 116 may provide the uncorrected data 153, an indication that the read operation 158 failed, or both, to the access device 130 in response to determining that the read operation 158 completed unsuccessfully.

The operations 200 may thus enable the device 103 to perform the read operation 158 in the background in response to determining that the first decode operation 151 failed, to perform the read operation 158 based on the context information 155 in response to detecting the resume condition 162, or both. Continuing the read operation 158 in the background, resuming the read operation 158 based on the context information 155, or both, may save time as compared to restarting the read operation 158.

Figure 3:
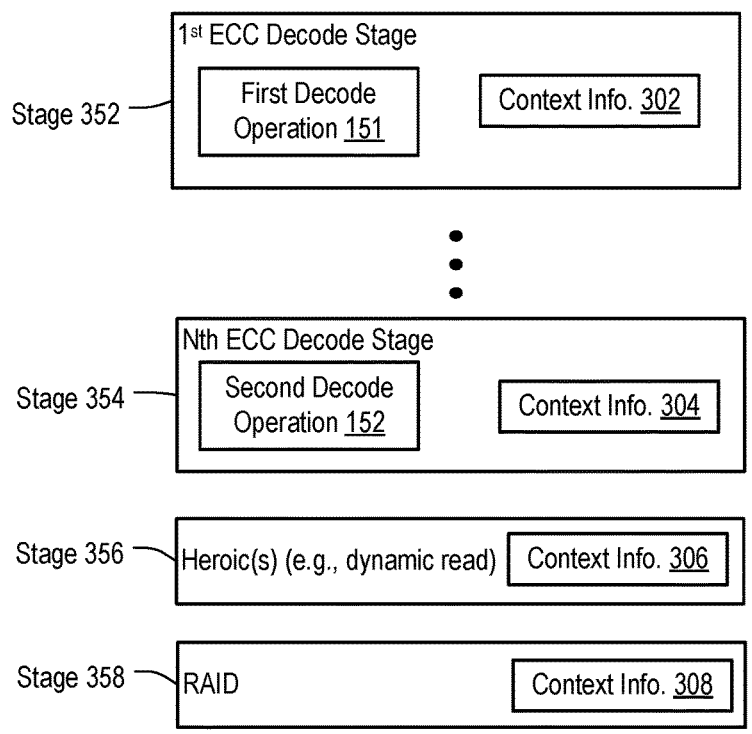
FIG. 3 is a diagram of an illustrative example of decode stages that the data storage device of FIG. 1 may be configured to perform.

Referring to FIG. 3, a diagram of an illustrative example of decode stages 350 is shown. The data recovery engine 116 may be configured to perform the decode stages 350.

The decode stages 350 may include a decode stage 352, a decode stage 354, a decode stage 356, a decode stage 358, one or more additional decode stages, or a combination thereof. The decode stages 350 may correspond to successive decode stages of the data recovery engine 116. For example, the data recovery engine 116 may be configured to perform a subsequent stage of the decode stages 350 in response to determining that a prior stage of the decode stages 350 failed.

One or more of the decode stages 350 may correspond to one or more operation modes of the same decoder. To illustrate, the decode stage 352 may correspond to a first decode mode (e.g., a lower-power operation mode) of the decoder of the ECC engine 114. The decode stage 354 may correspond to a second decode mode (e.g., a full-power operation mode) of the decoder of the ECC engine 114.

The decode stages 350 may correspond to one or more decoders of the controller 102. For example, the decode stage 356 may correspond to a decoder or dedicated circuitry of the controller 102 that is configured to perform heroics (e.g., dynamic reads). The decode stage 358 may correspond to another decoder (e.g., a RAID decoder) of the controller 102.

In a particular aspect, the data recovery engine 116 may be configured to generate the context information 155 based on the decode stage associated with the first decode operation 151. For example, the context information 155 may correspond to context information 302 when the first decode operation 151 is associated with the first decode mode (e.g., a lower-power operation mode) of the decoder of the ECC engine 114. The context information 155 may correspond to context information 304 when the first decode operation 151 is associated with the second decode mode (e.g., a full-power operation mode) of the decoder of the ECC engine 114. The context information 155 may correspond to context information 306 when the first decode operation 151 is associated with the decode stage 356. The context information 155 may correspond to context information 308 when the first decode operation 151 is associated with the decode stage 358.

The data recovery engine 116 may be configured to resume the read operation 158 in response to detecting the resume condition 162, as described with reference to FIG. 1. For example, the data recovery engine 116 may resume the read operation 158 by resuming the first decode operation 151 based on the context information 155, as described with reference to FIG. 1. As another example, the data recovery engine 116 may resume the read operation 158 by initiating the second decode operation 152 based on the context information 155, as described with reference to FIG. 1. In some aspects, the first decode operation 151 may be associated with a decoder (e.g., the decoder of the ECC engine 114) that is the same as a decoder associated with the second decode operation 152. In alternative aspects, the first decode operation 151 may be associated with a first decoder (e.g., the decoder of the ECC engine 114) that is distinct from a second decoder (e.g., the RAID decoder) associated with the second decode operation 152.

Resuming the read operation 158 based on the context information 155 in response to detecting the resume condition 162 may save time as compared to restarting the read operation 158 at the decode stage 352 independently of the context information 155. Reduced read latency at the access device 130 may be associated with resuming the read operation 158 as compared to restarting the read operation 158.

Although FIG. 3 depicts four stages, in other implementations the decode stages 350 may include fewer than or more than four stages. For example, one or more of the decode stages 350 may be omitted. As another example, one or more additional stages may be added to the decode stages 350. The one or more additional stages may include one or more ECC decoding stages or one or more additional heroics stages, as illustrative non-limiting examples.

Figure 4:
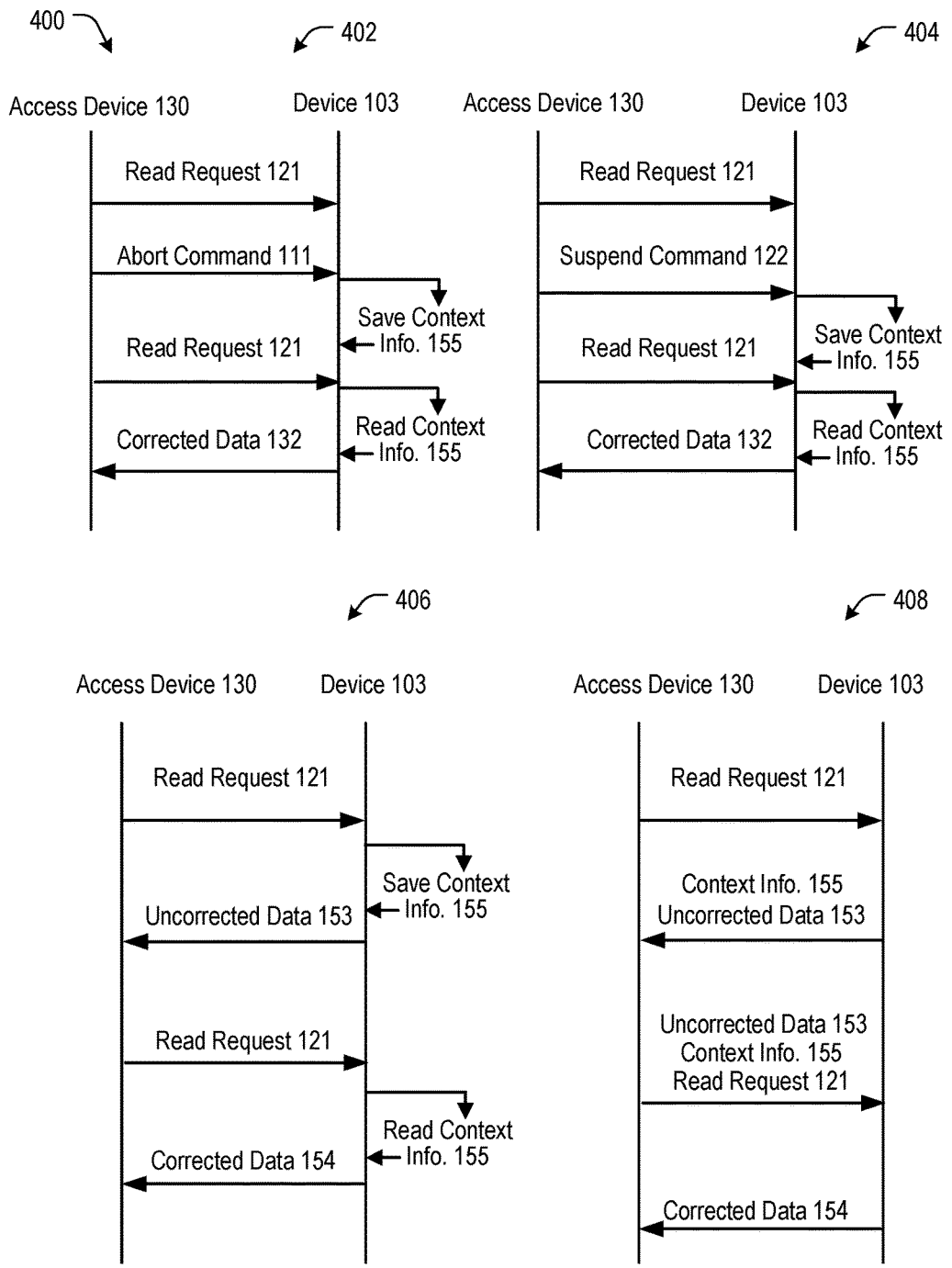
FIG. 4 is a diagram of illustrative examples of sequences of operations that may be performed by the data storage device and the access device of the system of FIG. 1.

Referring to FIG. 4, a diagram is shown and generally designated 400. The diagram 400 includes ladder diagrams illustrating operations 402, 404, 406, and 408. One or more of the operations 402-408 may be performed by the access device 130 or the device 103 (e.g., a data storage device) of FIG. 1.

The operations 402 include sending the read request 121 from the access device 130 to the device 103. The data recovery engine 116 of FIG. 1 may initiate the read operation 158 in response to receiving the read request 121, as described with reference to FIG. 1. For example, the data recovery engine 116 may initiate the first decode operation 151 in response to receiving the read request 121.

The operations 402 may also include sending the abort command 111 from the access device 130 to the device 103. The data recovery engine 116 of FIG. 1 may generate (or update) the context information 155 in response to receiving the abort command 111, as described with reference to FIG. 1. The data recovery engine 116 may store the context information 155 in the controller memory 124 of FIG. 1.

The operations 402 may further include sending the read request 121 (e.g., a second read request) from the access device 130 to the device 103. The data recovery engine 116 of FIG. 1 may, in response to receiving the read request 121 (e.g., the second read request) resume the read operation 158 based on the context information 155, as described with reference to FIG. 1.

The operations 402 may also include sending the corrected data 132 from the device 103 to the access device 130, as described with reference to FIG. 1. The operations 402 may thus enable resuming the read operation 158 based on the context information 155 subsequent to receiving the abort command 111.

The operations 404 differ from the operations 402 in that the suspend command 122 (as compared to the abort command 111) may be sent subsequent to sending the read request 121 from the access device 130 to the device 103. The data recovery engine 116 may generate (or update) the context information 155 in response to receiving the suspend command 122, as described with reference to FIG. 1. The access device 130 may send the read request 121 (e.g., a second read request) to the device 103. The data recovery engine 116 may, in response to receiving the read request 121 (e.g., the second read request) resume the read operation 158 based on the context information 155, as described with reference to FIG. 1. The operations 404 may thus enable resuming the read operation 158 based on the context information 155 subsequent to receiving the suspend command 122.

The operations 406 include sending the read request 121 from the access device 130 to the device 103. The data recovery engine 116 may initiate the read operation 158 in response to receiving the read request 121, as described with reference to FIG. 1. For example, the data recovery engine 116 may initiate the first decode operation 151 in response to receiving the read request 121.

The operations 406 may also include generating (or updating) the context information 155. For example, the data recovery engine 116 may generate (or update) the context information 155 in response to determining that the first decode operation 151 failed, as described with reference to FIG. 1.

The operations 406 may further include sending the uncorrected data 153 from the device 103 to the access device 130. For example, the data recovery engine 116 may send the uncorrected data 153 to the access device 130 in response to determining that the first decode operation 151 failed, as described with reference to FIG. 1.

The operations 406 may also include sending the read request 121 (e.g., a second read request) from the access device 130 to the device 103. For example, the access device 130 may send the read request 121 to the device 103 subsequent to receiving the uncorrected data 153. In a particular aspect, the access device 130 may determine whether to send the read request 121 (e.g., the second read request) based on the uncorrected data 153. For example, the access device 130 may send the read request 121 (e.g., the second read request) in response to determining that a number of errors associated with the uncorrected data 153 exceeds an error tolerance threshold of the access device 130. The read request 121 may indicate a request for a corrected version of the uncorrected data 153.

The operations 406 may further include resuming the read operation 158 based on the context information 155. For example, the data recovery engine 116 of FIG. 1 may, in response to receiving the read request 121 (e.g., the second read request), initiate the second decode operation 152 based on the context information 155.

The operations 406 may also include sending the corrected data 154 from the device 103 to the access device 130. For example, the data recovery engine 116 of FIG. 1 may send the corrected data 54 to the access device 130, as described with reference to FIG. 1. The operations 406 may thus enable sending the uncorrected data 153 to the access device 130 in response to determining that the first decode operation 151 failed.

The operations 408 differ from the operations 406 in that the context information 155 is sent in addition to the uncorrected data 153 from the device 103 to the access device 130 and that the context information 155 and the uncorrected data 153 are sent in addition to the read request 121 (e.g., a second read request) from the access device 130 to the device 103. For example, the data recovery engine 116 of FIG. 1 may send the context information 155 and the uncorrected data 153 to the access device 130 in response to determining that the first decode operation 151 failed, as described with reference to FIG. 1. The access device 130 may send the context information 155, the uncorrected data 153, and the read request 121 (e.g., the second read request) to the device 103. The data recovery engine 116 may, in response to receiving the read request 121 (e.g., the second read request), resume the read operation 158 based on the context information 155 and the uncorrected data 153 received from the access device 130. The data recovery engine 116 may provide the corrected data 154 to the access device 130. The operations 408 may thus enable resuming the read operation 158 based on the context information 155 and the uncorrected data 153 received from the access device 130.

Figure 5:
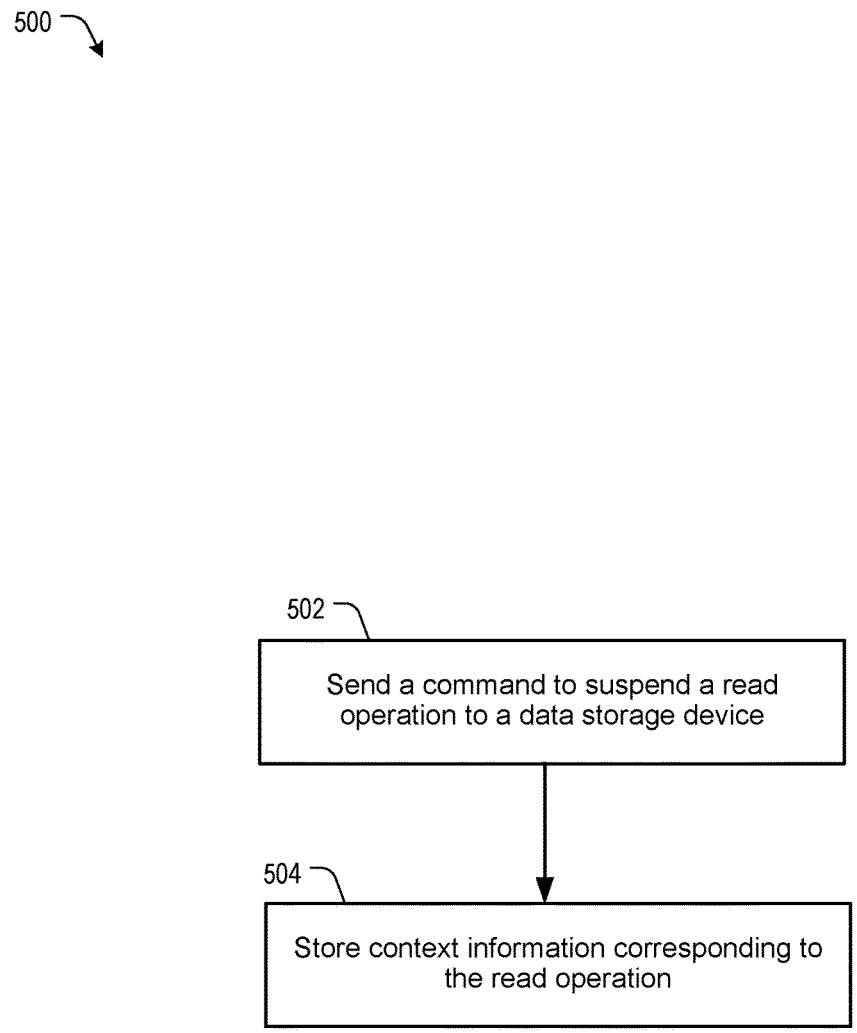
FIG. 5 is a flow diagram of a particular example of a method of operation of the access device of the system of FIG. 1.

Referring to FIG. 5, a method of operation is shown and generally designated 500. The method 500 may be performed by at least one of the access device 130 or the system 100 of FIG. 1.

The method 500 includes sending a command to suspend a read operation to a data storage device, at 502. For example, the access device 130 of FIG. 1 may send the suspend command 122 (or the abort command 111) to suspend the read operation 158 to the device 103 (e.g., a data storage device), as described with reference to FIG. 1.

The method 500 also includes storing context information corresponding to the read operation, at 504. For example, the access device 130 of FIG. 1 may store the context information 155 received from the device 103 responsive to sending the suspend command 122 (or the abort command 111), as described with reference to FIG. 1. The context information 155 may correspond to the read operation 158, as described with reference to FIG. 1.

The method 500 may enable the access device 130 to store the context information 155 subsequent to sending the suspend command 122 (or the abort command 111) to suspend the read operation 158. The access device 130 may subsequently send the context information 155 to the device 103 to enable the device 103 to resume the read operation 158 based on the context information 155.

Figure 6A:
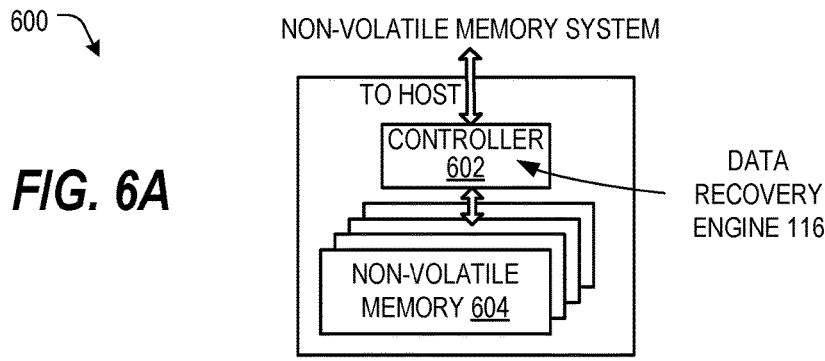
FIG. 6A is a block diagram of an illustrative example of a non-volatile memory system including a controller that includes a data recovery engine of FIG. 1.
Figure 6B:
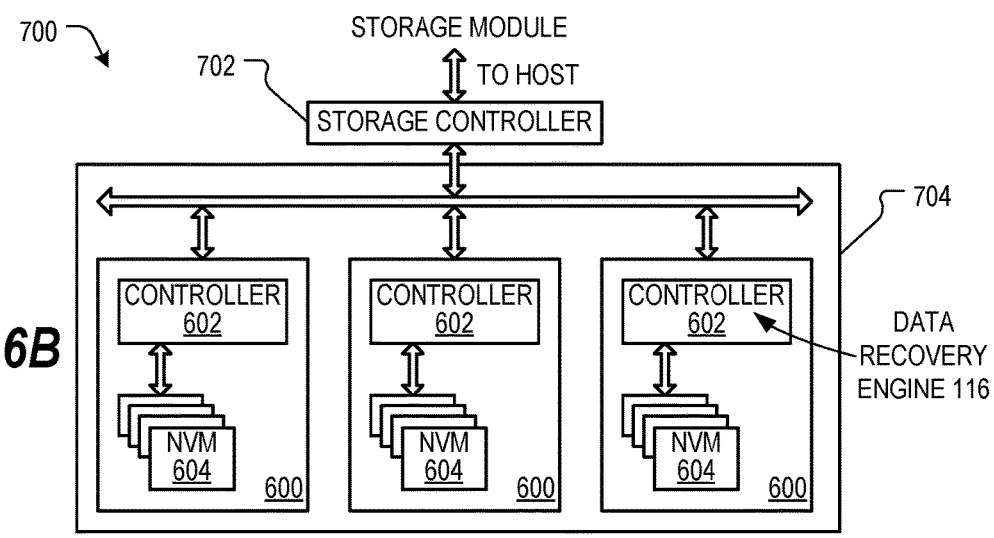
FIG. 6B is a block diagram of an illustrative example of a storage module that includes plural non-volatile memory systems that each may include the data recovery engine of FIG. 1.
Figure 6C:
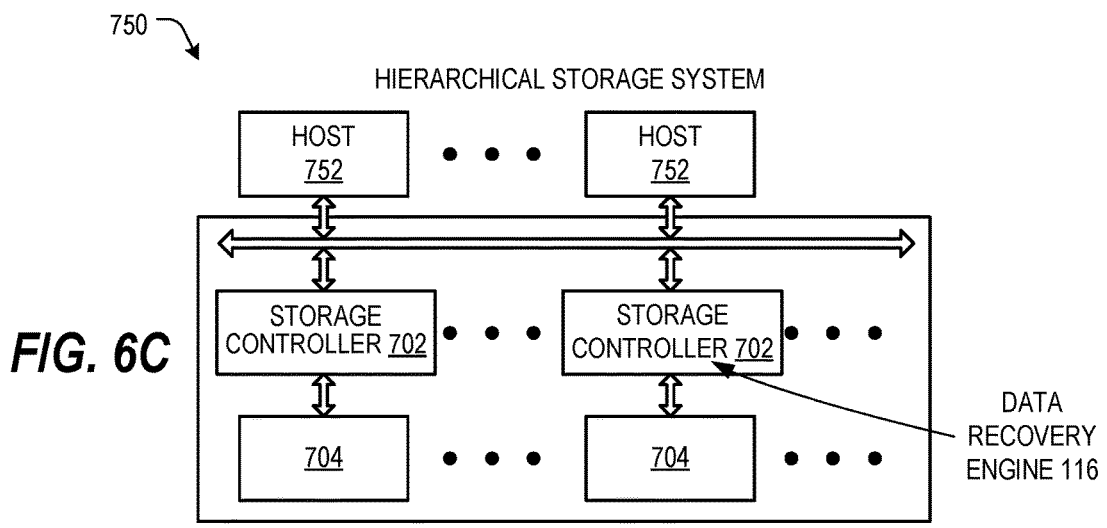
FIG. 6C is a block diagram of an illustrative example of a hierarchical storage system that includes a plurality of storage controllers that each may include the data recovery engine of FIG. 1.

Memory systems suitable for use in implementing aspects of the disclosure are shown in FIGS. 6A-6C. FIG. 6A is a block diagram illustrating a non-volatile memory system according to an example of the subject matter described herein. Referring to FIG. 6A, a non-volatile memory system 600 includes a controller 602 and non-volatile memory (e.g., the non-volatile memory 106 of FIG. 1) that may be made up of one or more non-volatile memory die 604. As used herein, the term "memory die" refers to the collection of non-volatile memory cells, and associated circuitry for managing the physical operation of those non-volatile memory cells, that are formed on a single semiconductor substrate. The controller 602 may correspond to the controller 102 of FIG. 1. Controller 602 interfaces with a host system (e.g., the access device 130 of FIG. 1) and transmits command sequences for read, program, and erase operations to non-volatile memory die 604. The controller 602 may include the data recovery engine 116 of FIG. 1.

The controller 602 (which may be a flash memory controller) can take the form of processing circuitry, a microprocessor or processor, and a computer-readable medium that stores computer-readable program code (e.g., firmware) executable by the (micro)processor, logic gates, switches, an application specific integrated circuit (ASIC), a programmable logic controller, and an embedded microcontroller, for example. The controller 602 can be configured with hardware and/or firmware to perform the various functions described below and shown in the flow diagrams. Also, some of the components shown as being internal to the controller can be stored external to the controller, and other components can be used. Additionally, the phrase "operatively in communication with" could mean directly in communication with or indirectly (wired or wireless) in communication with through one or more components, which may or may not be shown or described herein.

As used herein, a flash memory controller is a device that manages data stored on flash memory and communicates with a host, such as a computer or electronic device. A flash memory controller can have various functionality in addition to the specific functionality described herein. For example, the flash memory controller can format the flash memory, map out bad flash memory cells, and allocate spare cells to be substituted for future failed cells. Some part of the spare cells can be used to hold firmware to operate the flash memory controller and implement other features. In operation, when a host is to read data from or write data to the flash memory, the host communicates with the flash memory controller. If the host provides a logical address to which data is to be read/written, the flash memory controller can convert the logical address received from the host to a physical address in the flash memory. (Alternatively, the host can provide the physical address.) The flash memory controller can also perform various memory management functions, such as, but not limited to, wear leveling (distributing writes to avoid wearing out specific blocks of memory that would otherwise be repeatedly written to) and garbage collection (after a block is full, moving only the valid pages of data to a new block, so the full block can be erased and reused).

Non-volatile memory die 604 may include any suitable non-volatile storage medium, including NAND flash memory cells and/or NOR flash memory cells. The memory cells can take the form of solid-state (e.g., flash) memory cells and can be one-time programmable, few-time programmable, or many-time programmable. The memory cells can also be single-level cells (SLC), multiple-level cells (MLC), triple-level cells (TLC), or use other memory cell level technologies, now known or later developed. Also, the memory cells can be fabricated in a two-dimensional or three-dimensional fashion.

The interface between controller 602 and non-volatile memory die 604 may be any suitable flash interface, such as Toggle Mode 200, 400, or 800. In one embodiment, non-volatile memory system 600 may be a card based system, such as a secure digital (SD) or a micro secure digital (micro-SD) card. In an alternate embodiment, memory system 600 may be part of an embedded memory system.

Although, in the example illustrated in FIG. 6A, non-volatile memory system 600 (sometimes referred to herein as a storage module) includes a single channel between controller 602 and non-volatile memory die 604, the subject matter described herein is not limited to having a single memory channel. For example, in some NAND memory system architectures (such as the ones shown in FIGS. 6B and 6C), 2, 4, 8 or more NAND channels may exist between the controller and the NAND memory device, depending on controller capabilities. In any of the embodiments described herein, more than a single channel may exist between the controller 602 and the non-volatile memory die 604, even if a single channel is shown in the drawings.

FIG. 6B illustrates a storage module 700 that includes plural non-volatile memory systems 600. As such, storage module 700 may include a storage controller 702 that interfaces with a host and with storage system 704, which includes a plurality of non-volatile memory systems 600. The interface between storage controller 702 and non-volatile memory systems 600 may be a bus interface, such as a serial advanced technology attachment (SATA) or peripheral component interface express (PCIe) interface. Storage module 700, in one embodiment, may be a solid state drive (SSD), such as found in portable computing devices, such as laptop computers, and tablet computers. Each controller 602 of FIG. 6B may include a data recovery engine corresponding to the data recovery engine 116.

Alternatively or in addition, the storage controller 702 may include a data recovery engine corresponding to the data recovery engine 116.

FIG. 6C is a block diagram illustrating a hierarchical storage system. A hierarchical storage system 750 includes a plurality of storage controllers 702, each of which controls a respective storage system 704. Host systems 752 may access memories within the hierarchical storage system 750 via a bus interface. In one embodiment, the bus interface may be a Non-Volatile Memory Express (NVMe) or fiber channel over Ethernet (FCoE) interface. In one embodiment, the hierarchical storage system 750 illustrated in FIG. 6C may be a rack mountable mass storage system that is accessible by multiple host computers, such as would be found in a data center or other location where mass storage is needed. Each storage controller 702 of FIG. 6C may include a data recovery engine corresponding to the data recovery engine 116.

Figure 7A:
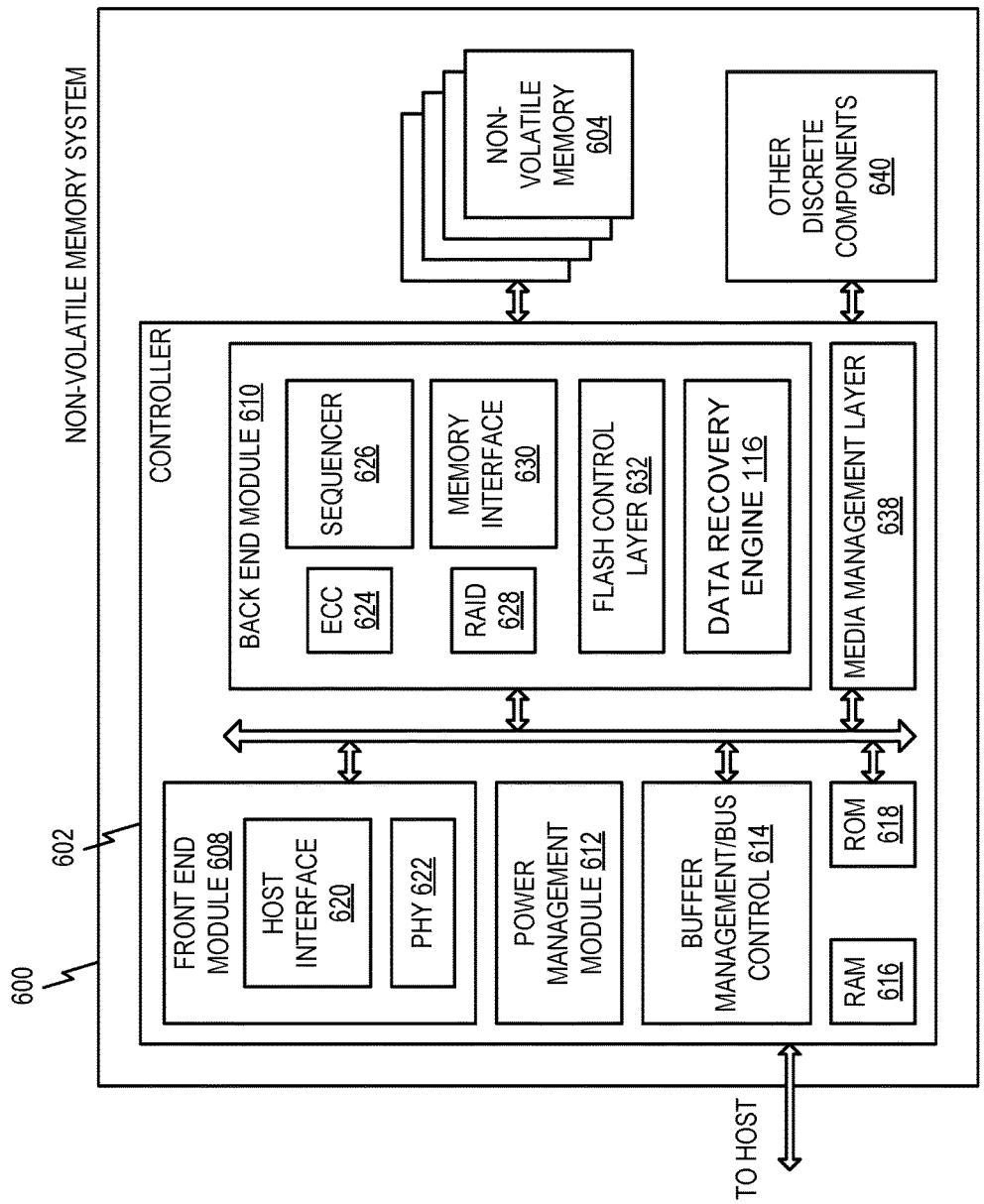
FIG. 7A is a block diagram illustrating an example of a non-volatile memory system including a controller that includes the data recovery engine of FIG. 1.

FIG. 7A is a block diagram illustrating exemplary components of the controller 602 in more detail. The controller 602 includes a front end module 608 that interfaces with a host, a back end module 610 that interfaces with the one or more non-volatile memory die 604, and various other modules that perform other functions. A module may take the form of a packaged functional hardware unit designed for use with other components, a portion of a program code (e.g., software or firmware) executable by a (micro)processor or processing circuitry that usually performs a particular function of related functions, or a self-contained hardware or software component that interfaces with a larger system, for example.

Referring again to modules of the controller 602, a buffer manager/bus controller 614 manages buffers in random access memory (RAM) 616 and controls the internal bus arbitration of the controller 602. A read only memory (ROM) 618 stores system boot code. Although illustrated in FIG. 7A as located within the controller 602, in other embodiments one or both of the RAM 616 and the ROM 618 may be located externally to the controller 602. In yet other embodiments, portions of RAM and ROM may be located both within the controller 602 and outside the controller 602.

Front end module 608 includes a host interface 620 and a physical layer interface (PHY) 622 that provide the electrical interface with the host or next level storage controller. The choice of the type of host interface 620 can depend on the type of memory being used. Examples of host interfaces 620 include, but are not limited to, SATA, SATA Express, Serial Attached Small Computer System Interface (SAS), Fibre Channel, USB, PCIe, and NVMe. The host interface 620 typically facilitates transfer for data, control signals, and timing signals.

Back end module 610 includes an error correction code (ECC) engine 624 that encodes the data received from the host, and decodes and error corrects the data read from the non-volatile memory. A command sequencer 626 generates command sequences, such as program and erase command sequences, to be transmitted to non-volatile memory die 604. A RAID (Redundant Array of Independent Drives) module 628 manages generation of RAID parity and recovery of failed data. The RAID parity may be used as an additional level of integrity protection for the data being written into the non-volatile memory die 604. In some cases, the RAID module 628 may be a part of the ECC engine 624. A memory interface 630 provides the command sequences to non-volatile memory die 604 and receives status information from non-volatile memory die 604. For example, the memory interface 630 may be a double data rate (DDR) interface, such as a Toggle Mode 200, 400, or 800 interface. A flash control layer 632 controls the overall operation of back end module 610. The back end module 610 may also include the data recovery engine 116.

Additional components of system 600 illustrated in FIG. 7A include a power management module 612 and a media management layer 638, which performs wear leveling of memory cells of non-volatile memory die 604. System 600 also includes other discrete components 640, such as external electrical interfaces, external RAM, resistors, capacitors, or other components that may interface with controller 602. In alternative embodiments, one or more of the physical layer interface 622, RAID module 628, media management layer 638 and buffer management/bus controller 614 are optional components that are omitted from the controller 602.

Figure 7B:
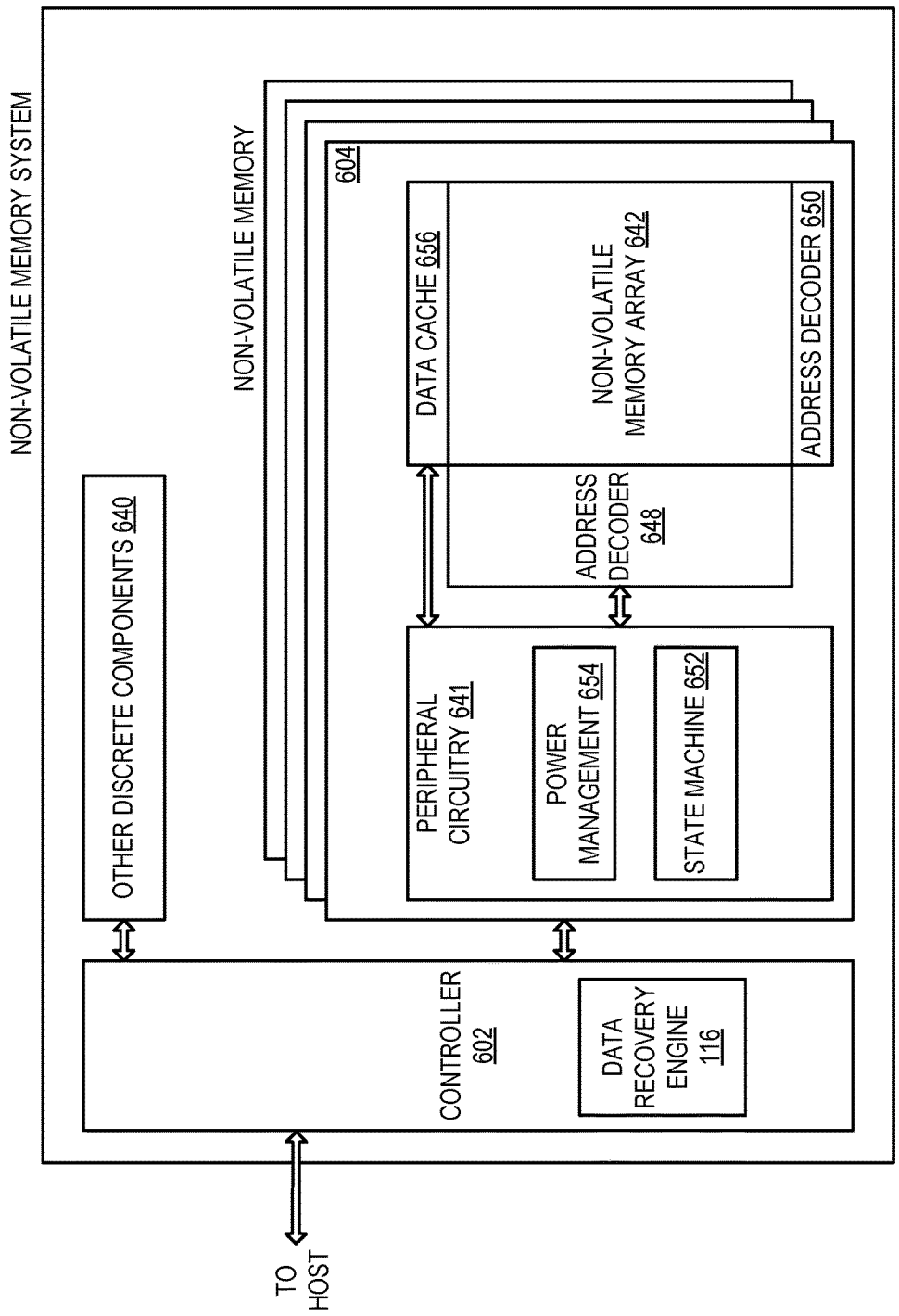
FIG. 7B is a block diagram illustrating exemplary components of a non-volatile memory die that may be coupled to a controller that includes the data recovery engine of FIG. 1.

FIG. 7B is a block diagram illustrating exemplary components of non-volatile memory die 604 in more detail. Non-volatile memory die 604 includes peripheral circuitry 641 and non-volatile memory array 642. Non-volatile memory array 642 includes the non-volatile memory cells used to store data. The non-volatile memory cells may be any suitable non-volatile memory cells, including NAND flash memory cells and/or NOR flash memory cells in a two dimensional and/or three dimensional configuration. Peripheral circuitry 641 includes a state machine 652 that provides status information to controller 602, which may include the data recovery engine 116. The peripheral circuitry 641 may also include a power management or data latch control module 654. Non-volatile memory die 604 further includes discrete components 640, an address decoder 648, an address decoder 650, and a data cache 656 that caches data.

Although various components depicted herein are illustrated as block components and described in general terms, such components may include one or more microprocessors, state machines, or other circuits configured to enable the data recovery engine 116 to initiate the read operation 158, suspend the read operation 158, store the context information 155, resume the read operation 158, or a combination thereof, as described above with reference to FIGS. 1-7B. For example, the data recovery engine 116 may represent physical components, such as hardware controllers, state machines, logic circuits, or other structures, to start the read operation 158, suspend the read operation 158, store the context information 155, provide the context information 155 to the access device 130, receive the context information 155 from the access device 130, resume the read operation 158 based on the context information 155, or a combination thereof. The data recovery engine 116 may be implemented using a microprocessor or microcontroller programmed to initiate the read operation 158, suspend the read operation 158, store the context information 155, resume the read operation 158, or a combination thereof.

In a particular embodiment, the device 103 may be implemented in a portable device configured to be selectively coupled to one or more external devices. However, in other embodiments, the device 103 may be attached or embedded within one or more host devices, such as within a housing of a host communication device. For example, the device 103 may be within a packaged apparatus such as a wireless telephone, a personal digital assistant (PDA), a gaming device or console, a portable navigation device, or other device that uses internal non-volatile memory. In a particular embodiment, the device 103 may include a non-volatile memory, such as a three-dimensional (3D) memory, a flash memory (e.g., NAND, NOR, Multi-Level Cell (MLC), a Divided bit-line NOR (DINOR) memory, an AND memory, a high capacitive coupling ratio (HiCR), asymmetrical contactless transistor (ACT), or other flash memories), an erasable programmable read-only memory (EPROM), an electrically-erasable programmable read-only memory (EEPROM), a read-only memory (ROM), a one-time programmable memory (OTP), or any other type of memory.

The illustrations of the embodiments described herein are intended to provide a general understanding of the various embodiments. Other embodiments may be utilized and derived from the disclosure, such that structural and logical substitutions and changes may be made without departing from the scope of the disclosure. This disclosure is intended to cover any and all subsequent adaptations or variations of various embodiments.

The above-disclosed subject matter is to be considered illustrative, and not restrictive, and the appended claims are intended to cover all such modifications, enhancements, and other embodiments, which fall within the scope of the present disclosure. Thus, to the maximum extent allowed by law, the scope of the present disclosure is to be determined by the broadest permissible interpretation of the following claims and their equivalents, and shall not be restricted or limited by the foregoing detailed description.

What is claimed is:

1. A data storage device comprising:
   a non-volatile memory; and
   a controller coupled to the non-volatile memory, the controller configured to:
   initiate a read operation to retrieve data from the non-volatile memory;
   suspend the read operation;
   determine context information associated with the suspended read operation; and
   in response to detection of a condition associated with the read operation, resume the suspended read operation using the context information.

2. The data storage device of claim 1, wherein the controller includes a controller memory and is further configured to:
   suspend the read operation in response to detection of a suspend condition;
   store the context information in the controller memory in response to the detection of the suspend condition; and
   retrieve the context information from the controller memory prior to resuming the suspended read operation.

3. The data storage device of claim 2, wherein the suspend condition comprises failure of a decode operation.

4. The data storage device of claim 3, wherein the controller is further configured to resume the suspended read operation by performing a second decode operation based on the context information.

5. The data storage device of claim 2, wherein the suspend condition comprises receipt of a suspend command from an access device.

6. The data storage device of claim 2, wherein the controller is further configured to retrieve the context information from the controller memory in response to detection of the suspend condition.

7. The data storage device of claim 1, wherein the controller is further configured to:
   provide the context information to an access device; and
   prior to resuming the suspended read operation, to receive the context information from the access device.

8. The data storage device of claim 1, wherein the controller is further configured to:
   suspend the read operation in response to detection of a suspend condition; and
   provide the context information to an access device in response to the detection of the suspend condition.

9. The data storage device of claim 1, wherein the context information is associated with uncorrected data, a decode stage, a decoder memory state, or a combination thereof.

10. The data storage device of claim 1, wherein the detected condition comprises receipt of:
    a read request from an access device, the read request configured to indicate an address of the data; or
    a resume command from the access device.

11. A device comprising:
    an interface configured to be coupled to a data storage device; and
    a storage controller coupled to the interface, the storage controller configured to, in response to receipt of an indication of uncorrected data from the data storage device and of context information associated with the uncorrected data, send the context information to the data storage device in conjunction with a request for a corrected version of the uncorrected data.

12. The device of claim 11, wherein the storage controller is further configured to:
    send, via the interface to the data storage device, a command to suspend a read operation; and
    receive the indication of uncorrected data is responsive to the command.

13. The device of claim 11, wherein the request for the corrected version of the uncorrected data is configured to indicate that a suspended read operation is to resume.

14. The device of claim 11, wherein the context information is associated with at least one of a decode stage or a decoder memory state.

15. A method comprising:
    at a device coupled to a data storage device, the device configured to communicate with the data storage device via a communication path, performing:
    sending, to the data storage device via the communication path, a command to suspend a read operation; and
    storing context information, the context information corresponding to the read operation.

16. The method of claim 15, wherein the communication path includes an interconnect, and further comprising receiving the context information from the data storage device responsive to sending the command to suspend the read operation.

17. The method of claim 15, wherein the context information is stored in a memory of the device.

18. The method of claim 15, further comprising sending, to the data storage device, the context information in conjunction with a second command configured to resume the suspended read operation.

19. An apparatus comprising:
    means for storing data; and
    means for controlling the means for storing data, the means for controlling configured to:
    initiate a read operation to retrieve data from the means for storing data;
    suspend the read operation;
    determine context information associated with the suspended read operation; and
    in response to detection of a condition associated with the read operation, resume the suspended read operation using the context information.

20. The apparatus of claim 19, wherein the means for controlling is further configured to:
- provide the context information to second means for storing data; and
- prior to resuming the suspended read operation, receive the context information from the second means for storing data.

\* \* \* \* \*